(12) United States Patent  (10) Patent No.: US 7,760,515 B2
Sun (45) Date of Patent: Jul. 20, 2010

(54) ELECTRONIC DEVICE WITH EMI SHIELDING ASSEMBLY

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 567 days.

(21) Appl. No.: 11/752,935

(22) Filed: May 24, 2007

(65) Prior Publication Data

US 2008/0080159 A1    Apr. 3, 2008

(30) Foreign Application Priority Data

Sep. 28, 2006   (CN)   .................... 2006 2 0200807 U

(51) Int. Cl.
*H05K 9/00*   (2006.01)
(52) U.S. Cl. ........................ 361/818; 361/800; 361/816; 174/350; 174/377
(58) Field of Classification Search .................. 361/753, 361/799, 800, 816, 818; 174/350, 377
See application file for complete search history.

(56) References Cited

U.S. PATENT DOCUMENTS

| 5,436,802 | A | * | 7/1995 | Trahan et al. | 361/816 |
| 5,886,879 | A | * | 3/1999 | Matuschik | 361/818 |
| 6,178,097 | B1 | * | 1/2001 | Hauk, Jr. | 361/816 |
| 6,342,674 | B1 | * | 1/2002 | Liu et al. | 174/382 |
| 6,646,892 | B1 | * | 11/2003 | Hsu | 361/818 |

* cited by examiner

*Primary Examiner*—Dameon E Levi
(74) *Attorney, Agent, or Firm*—Frank R. Niranjan

(57) ABSTRACT

An EMI shielding assembly includes a bracket and a resilient shield. The bracket includes a top wall, a bottom wall, and a pair of sidewalls connected between the top wall and the bottom wall. A first and second opening are defined at opposite sides of the bracket and surrounded by the walls. Two face-to-face L-shaped plates extend from the pair of sidewalls respectively at the second opening. The shield is mounted between the L-shaped plates and covering the second opening.

10 Claims, 5 Drawing Sheets

ELECTRONIC DEVICE WITH EMI SHIELDING ASSEMBLY

BACKGROUND OF THE INVENTION

1. Field of the Invention

The present invention relates to electronic devices, and particularly to an electronic device having an EMI shielding assembly.

2. Description of Related Art

In the enclosure of a typical electronic device, there are generally many kinds of electronic components such as central processing units (CPUs) and accelerated chips mounted in a circuit board of the enclosure. The electronic components may emit electromagnetic radiation during operation causing electromagnetic interference (EMI). The EMI may influence other components mounted in the enclosure and may even lead to abnormal operation of those components.

Referring to FIG. 5, a typical electronic device such as a personal computer includes an enclosure 10, a circuit board 12, and an EMI shield 16. The enclosure 10 defines an opening in a sidewall thereof. The circuit board 12 includes a plurality of input/output (I/O) connectors 14. The I/O connectors 14 are mounted to a side of the circuit board 12 facing the sidewall of the enclosure 10. The EMI shield 16 is mounted to the circuit board 12 by fixing means, such as welding, screws, and so on. If an I/O connector 14 in the circuit board 12 needs to be replaced, the EMI shield 16 should be removed from the circuit board 12. However, the EMI shield 16 is not easily removed from the circuit board 12. The circuit board 12 may be damaged during removal and/or reinstallation of the EMI shield 16.

What is needed is to provide an EMI shielding assembly which is easily removed from a circuit board thereof.

SUMMARY OF THE INVENTION

An EMI shielding assembly includes a bracket, and a resilient shield. The bracket includes a top wall, a bottom wall, and a pair of sidewalls connected between the top wall and the bottom wall. A first opening and a second opening are defined at opposite sides of the bracket and surrounded by the walls. Two face-to-face L-shaped plates extend from the pair of sidewalls respectively at the second opening. The shield is mounted between the L-shaped plates and covering the second opening.

Other advantages and novel features of the invention will become more apparent from the following detailed description when taken in conjunction with the accompanying drawings, in which:

DETAILED DESCRIPTION OF THE INVENTION

Figure 1:
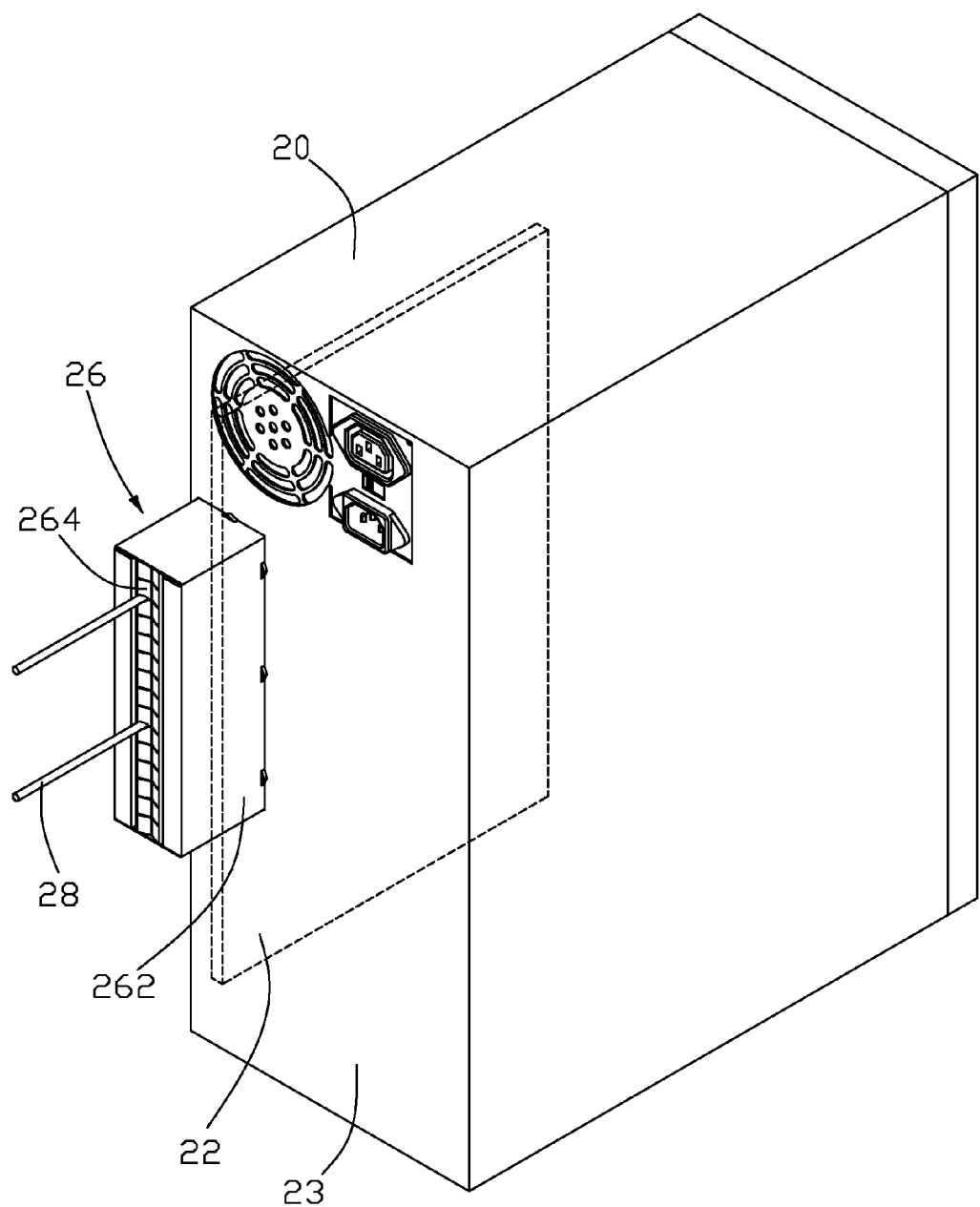
FIG. 1 is an assembled, isometric view of an enclosure with an EMI shielding assembly in accordance with a preferred embodiment of the present invention.
Figure 2:
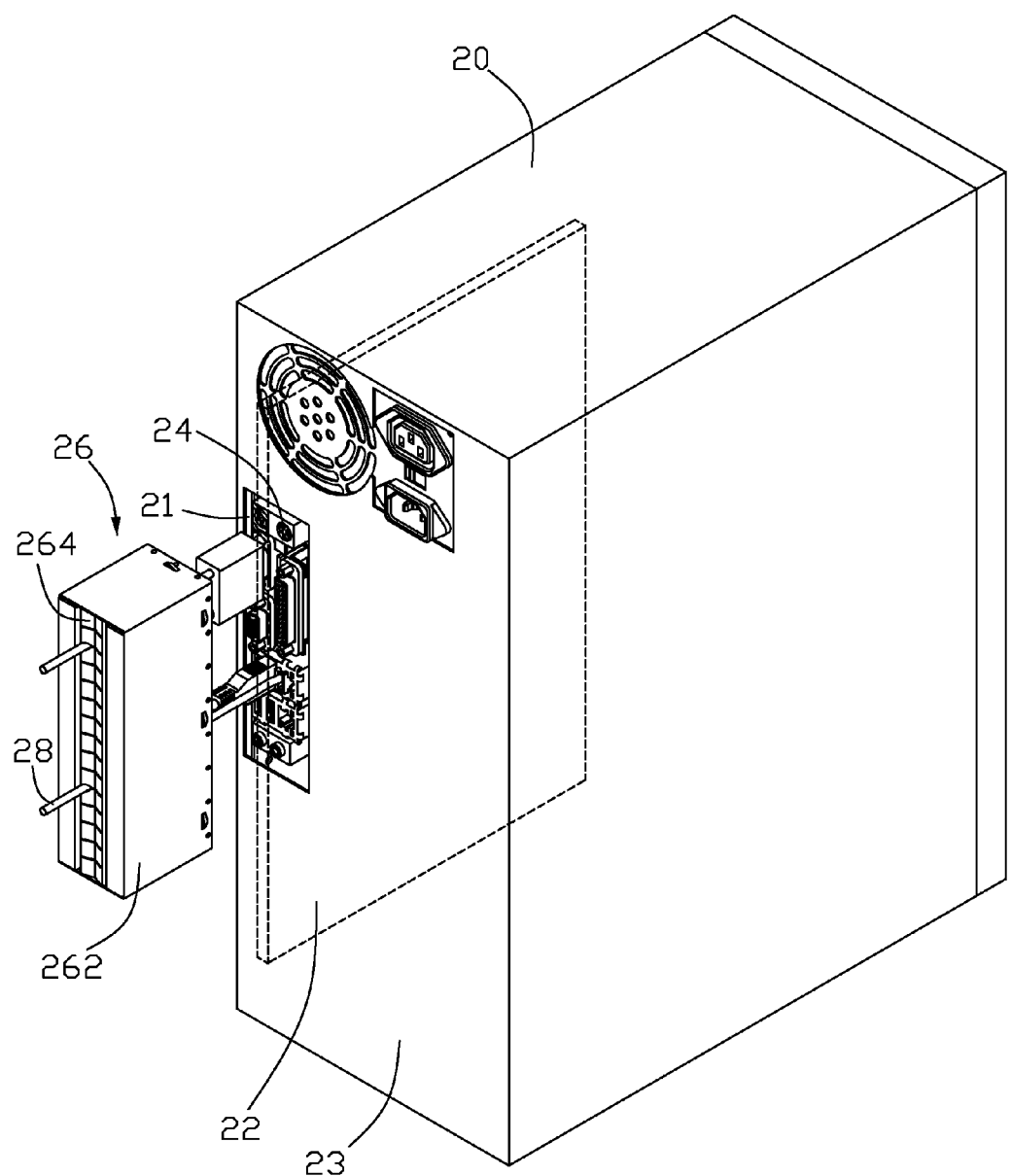
FIG. 2 is an exploded, isometric view of FIG. 1.

Referring to FIG. 1 and FIG. 2, an electronic device such as a personal computer in accordance with a preferred embodiment of the present invention includes an enclosure 20, a circuit board 22, and an EMI shielding assembly 26.

The enclosure 20 defines an opening 21 in a sidewall 23 thereof.

The circuit board 22 includes a plurality of input/output (I/O) connectors 24.

The I/O connectors 24 are mounted to a side of the circuit board 22 facing the sidewall 23 of the enclosure 20.

Figure 3:
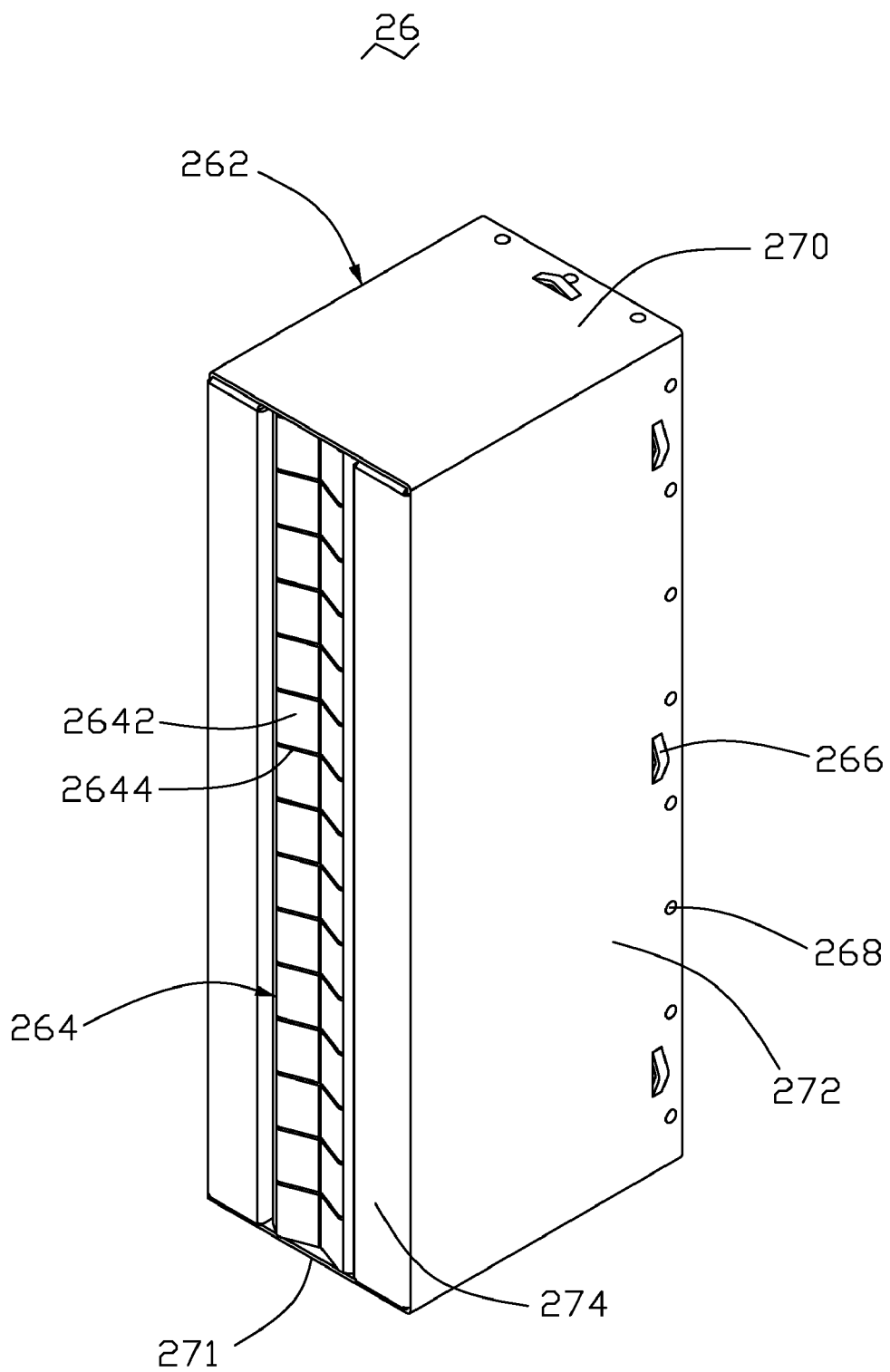
FIG. 3 is an isometric view of the EMI shielding assembly of FIG. 2.
Figure 4:
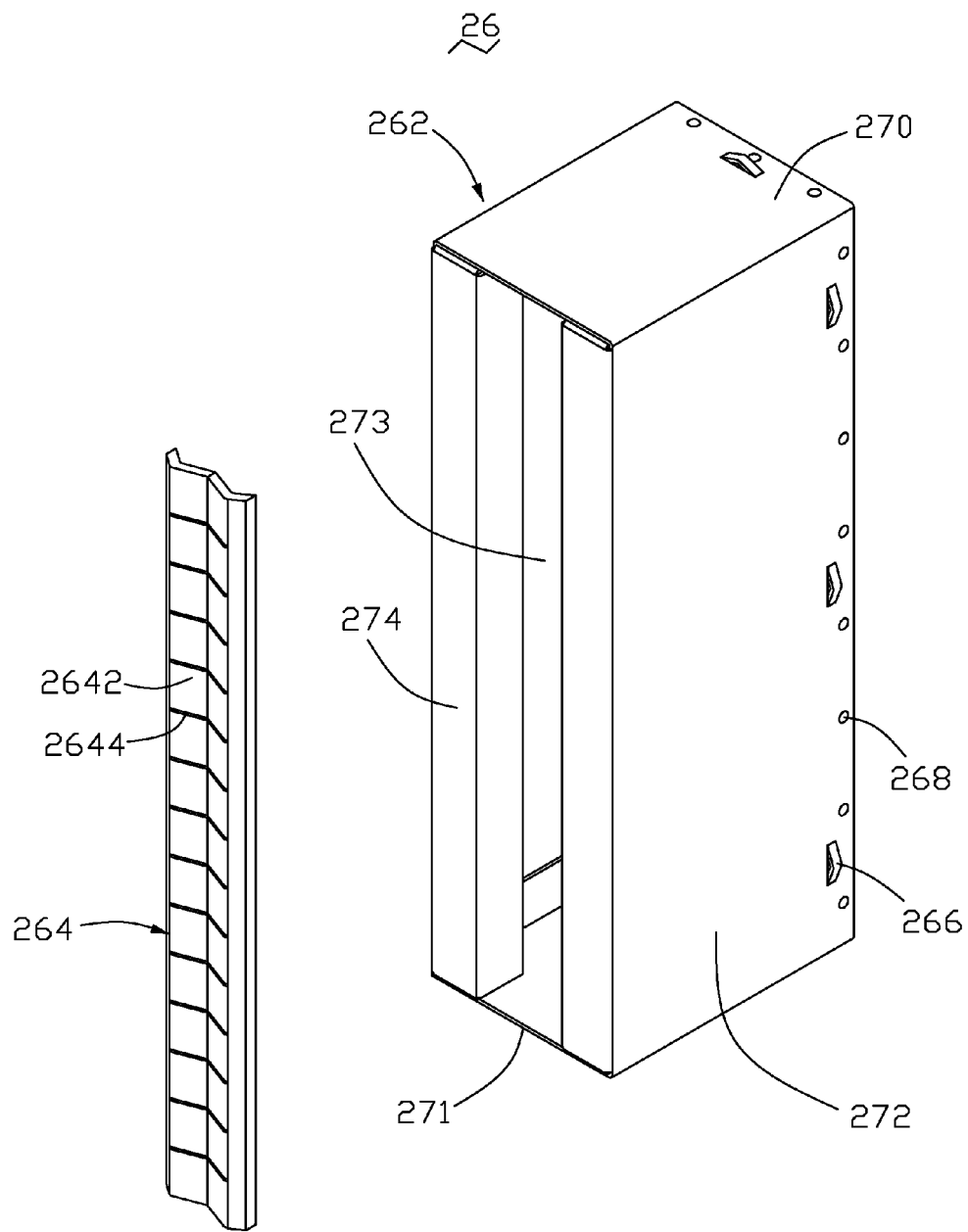
FIG. 4 is an exploded, isometric view of FIG. 3.
Figure 5:
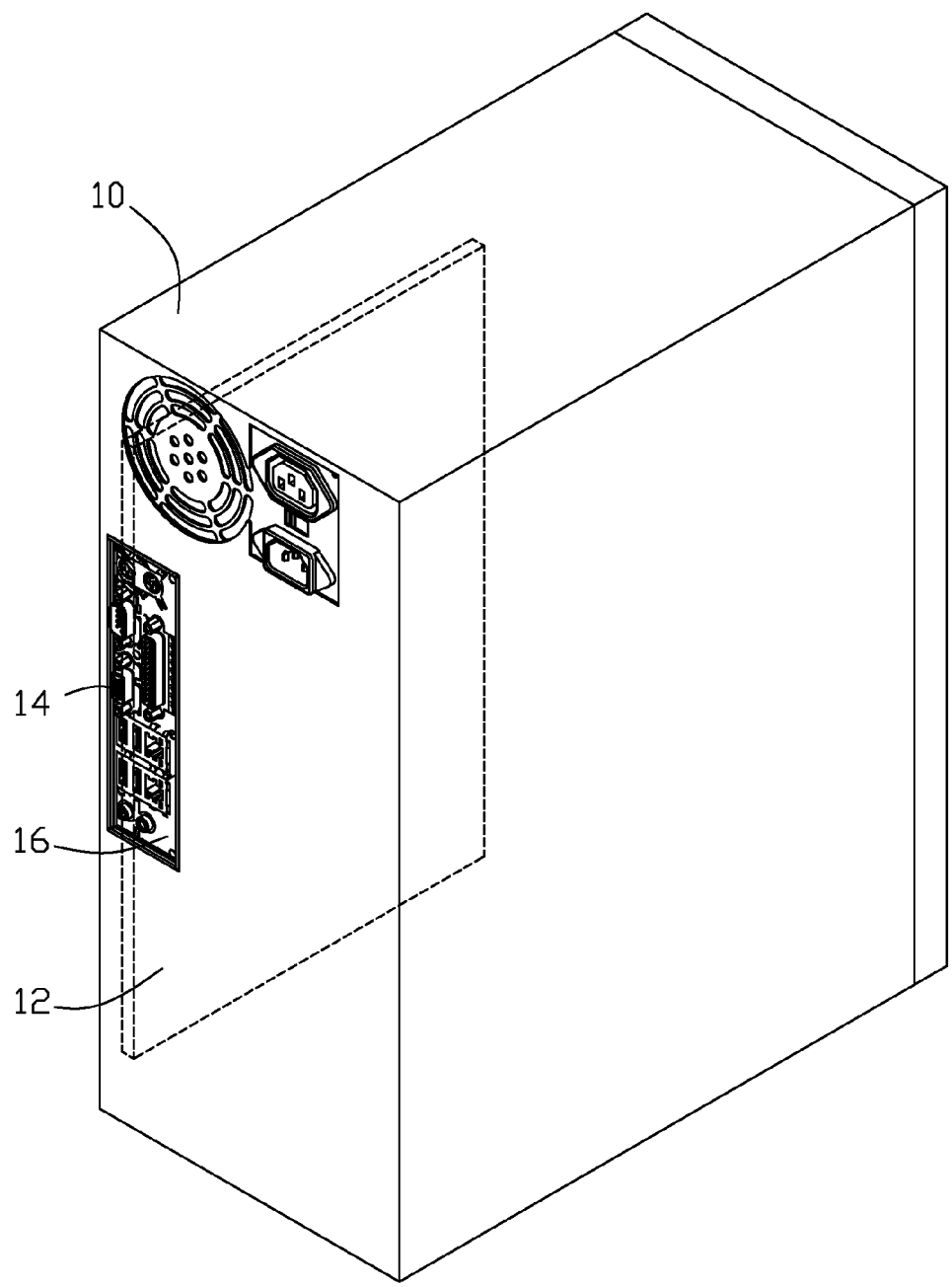
FIG. 5 is an isometric view of a typical enclosure with an EMI shield.

Referring also to FIG. 3 and FIG. 4, the EMI shielding assembly 26 includes a bracket 262 and a shield 264. The bracket 262 is made of resilient metal for shielding electromagnetic radiation. The bracket 262 is cubic, and includes a top wall 270, a bottom wall 271, and a pair of sidewalls 272. The bracket 262 is sized so that it will just fit into the opening 21 of the enclosure 20. A space is formed among the top wall 270, the bottom wall 271, and the pair of sidewalls 272. A first opening (not labeled) and a second opening 273 are defined at opposite front and rear sides of the bracket 262 respectively. The top wall 270, the bottom wall 271, and the pair of sidewalls 272 of the bracket 262 include a plurality of aligned elastic protruding portions 266, and aligned convex portions 268 offset from but parallel to the protruding portions 266, near the first opening. The protruding portions 266 are protruding bridges, and the convex portions 268 are global protrusions. The two alignments of the protruding portions 266 and the convex portions 268 are perpendicular to connecting edges of the top walls 270, and the sidewalls 272, and offset from each other just enough to allow edges of the sidewall of the enclosure 20 at the opening 21 to be sandwiched therebetween when the bracket 262 of the EMI shielding assembly 26 is fit into the opening 21. Two face-to-face L-shaped plates 274 extend from the pair of sidewalls 272 respectively at the second opening 273.

The shield 264 comprises two sections connected together. Each section is generally V-shaped, and is made of an elastic material. The shield 264 comprises a plurality of transverse resilient fingers 2642. A slit 2644 is defined between adjacent sides of each two adjacent fingers 2642 configured for allowing cable ends to pass therethrough. The shield 264 is mounted between the L-shaped plates 274, thus covering and shielding the second opening 273 of the bracket 262.

Referring to FIG. 1 and FIG. 2 again, in assembly, two cables 28 connectable to peripheral devices pass through two slits 2644 between resilient fingers of the shield 264 and plug into two I/O connectors 24 of the circuit board 22. Then the EMI shielding assembly 26 is manually inserted into the opening 21 of the enclosure 20. As the EMI shielding assembly 26 is inserted into the opening 21, areas of assembly 26 where the convex portions 268 are located, flex in then rebound after reaching an inside space of the enclosure 20. At this time, the protruding portions 266 abut against an outer surface of the sidewall of the enclosure 20, thereby sandwiching the edges of the sidewall of the enclosure 20 at the opening 21 between the protruding portions 266 and the convex portions 268. The bracket 262 is thus tightly secured to the enclosure 20, with the first opening of the bracket 262 facing to the opening 21, so that the bracket 262 may shield the opening 21 of the enclosure 20. The I/O connectors 24 of the circuit board 22 are accommodated in the space of the bracket 262. If an I/O connector 24 in the circuit board 22 needs to be replaced, the EMI shielding assembly 26 can be removed by manually grasping the assembly 26 and pulling it away from the sidewall 23 of the enclosure 20. Therefore, the EMI shielding assembly 26 is easily removed from the circuit board 22, preventing damage to the circuit board 22 during removal and/or reinstallation of the EMI shielding assembly 26.

It is believed that the present embodiment and its advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. An EMI shielding assembly comprising:
  a bracket including a top wall, a bottom wall, and a pair of side walls connected between the top wall and the bottom wall to surround a space therebetween, the space comprising a first opening communicating with an opening of a computer enclosure, and a second opening opposite to the first opening; and
  a resilient shield comprising a first edge, a second edge opposite to the first edge, a plurality of resilient fingers transverse from the first edge to the second edge, and a plurality of slits defined between every two adjacent resilient fingers to separate the resilient fingers from each other, wherein each slit is much smaller than a cable to achieve a good EMI shielding result when no cable extends therethrough;
  wherein the resilient shield is compressed between the pair of side walls to shield the second opening whereby shielding the opening of the computer enclosure, each of the slits allows cables to extend through the shield and the space to connect to the computer enclosure by elastically deforming the corresponding resilient fingers.

2. The EMI shielding assembly as claimed in claim 1, wherein the top wall, the bottom wall, and the pair of sidewalls include a plurality of aligned protruding portions, and aligned convex portions offset from but parallel to the protruding portions, near the first opening, the protruding portions abutting against an outer surface of a sidewall of the computer enclosure and the convex portion sliding into a third opening defined in the sidewall of the computer enclosure and abutting against an inner surface of the sidewall the computer enclosure, thereby sandwiching the edges of the sidewall of the computer enclosure at the third opening between the protruding portions and the convex portions.

3. The EMI shielding assembly as claimed in claim 1, wherein the bracket further comprises two face-to-face L-shaped plates extending from the pair of sidewalls respectively at the second opening, the first and the second edge of the resilient shield connected to the two L-shaped plates.

4. A computer with an EMI shielding assembly comprising:
  a bracket comprising a plurality of walls connected with each other to surround a space therebetween, the space comprising a first opening, and a second opening opposite to the first opening and shielded by a resilient shield, a plurality of aligned protruding portions and aligned convex portions offset from but parallel to the protruding portions being formed at the walls; and
  an enclosure comprising a plate defining an opening and a circuit board having a plurality of electronic components communicating with the opening;
  the bracket detachably secured to the enclosure, the protruding portions abutting against an outer surface of the plate of the enclosure and the convex portion sliding into the opening of the enclosure and abutting against an inner surface of the plate, thereby sandwiching the edges of the plate at the opening of the enclosure between the protruding portions and the convex portions, the first opening of the bracket aligning and facing the opening of the enclosure whereby the resilient shield shields the opening of the enclosure.

5. The computer as claimed in claim 4, wherein the bracket further comprises two face-to-face L-shaped plates formed at the second opening, the shield being compressed between the two L-shaped plates.

6. The computer as claimed in claim 4, wherein the shield comprises a first edge, a second edge opposite to the first edge, a plurality of resilient fingers transverse from the first edge to the second edge, and a plurality of slits defined between every two adjacent resilient fingers to separate the resilient fingers from each other, each slit is much smaller than a connector cable to achieve a good EMI shielding result when no connector cable extends therethrough, and allows connector cables to extend through the shield and the space to connect to the electronic components of the enclosure by elastically deforming the corresponding resilient fingers, the first and second edges are connected to the two L-shaped plates respectively.

7. A computer comprising:
  a computer enclosure comprising a sidewall defining an opening, and a circuit board having a plurality of connectors communicating with the opening, a plurality of cables connected to the connectors;
  a bracket comprising a plurality of walls connected with each other to surround a space therebetween, the space comprising a first opening and a second opening, a plurality of aligned protruding portions and aligned convex portions offset from but parallel to the protruding portions being formed at the walls, the bracket being attached to the computer enclosure with the first opening aligning and facing the opening of the computer enclosure via the protruding portions and the convex portions sandwiching an edge of the sidewall at the opening of the computer enclosure; and
  a shield comprising a first edge, a second edge opposite to the first edge, a plurality of resilient fingers transverse from the first edge to the second edge, and a plurality of slits defined between every two adjacent resilient fingers to separate the resilient fingers from each other, the shield mounted to the bracket and covering the second opening to thereby shield the opening of the computer enclosure, each of the slits much smaller than a cable to achieve a good EMI shielding result when no cable extends therethrough, and allowing the cables to extend through the space and the shield by elastically deforming the corresponding resilient fingers.

8. The computer as claimed in claim 7, wherein the shield is made of elastic material.

9. The computer as claimed in claim 7, wherein the bracket further comprises a pair of L-shaped plates formed at the second opening, the shield being compressed between the two L-shaped plates with the first and second edges connected to the two L-shaped plates respectively.

10. The computer as claimed in claim 7, wherein the convex portions are global-shaped projections formed at outer faces of the walls and abut an inner face of the edge of the sidewall of the computer enclosure, and the protruding portions are bridges protruding out from the outer faces of the walls and abut an outer face of the sidewall of the computer enclosure.

* * * * *